United States Patent
Lin et al.

(10) Patent No.: US 11,664,305 B2
(45) Date of Patent: May 30, 2023

(54) STAGGERED LINES FOR INTERCONNECT PERFORMANCE IMPROVEMENT AND PROCESSES FOR FORMING SUCH

(71) Applicant: Intel Corporation, Santa Clara, CA (US)

(72) Inventors: Kevin Lai Lin, Beaverton, OR (US); Manish Chandhok, Beaverton, OR (US); Miriam Reshotko, Portland, OR (US); Christopher Jezewski, Portland, OR (US); Eungnak Han, Portland, OR (US); Gurpreet Singh, Portland, OR (US); Sarah Atanasov, Beaverton, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 820 days.

(21) Appl. No.: 16/455,662

(22) Filed: Jun. 27, 2019

(65) Prior Publication Data
US 2020/0411427 A1    Dec. 31, 2020

(51) Int. Cl.
*H01L 23/522*    (2006.01)
*H01L 21/768*    (2006.01)
*H01L 23/528*    (2006.01)

(52) U.S. Cl.
CPC .... *H01L 23/5222* (2013.01); *H01L 21/76802* (2013.01); *H01L 23/528* (2013.01); *H01L 23/5226* (2013.01)

(58) Field of Classification Search
CPC .......... H01L 23/5222; H01L 21/76802; H01L 23/5226; H01L 23/528
See application file for complete search history.

(56) References Cited

U.S. PATENT DOCUMENTS

2007/0211510 A1*   9/2007   Madan .................... G11C 11/22
                                                                                 365/65
2022/0093505 A1*   3/2022   Jezewski ........... H01L 21/76834

* cited by examiner

*Primary Examiner* — Anthony Ho
(74) *Attorney, Agent, or Firm* — Schwabe, Williamson & Wyatt P.C.

(57) ABSTRACT

An interconnect structure is disclosed. The interconnect structure includes a first line of interconnects and a second line of interconnects. The first line of interconnects and the second line of interconnects are staggered. The individual interconnects of the second line of interconnects are laterally offset from individual interconnects of the first line of interconnects. A dielectric material is adjacent to at least a portion of the individual interconnects of at least one of the first line of interconnects and the second line of interconnects.

20 Claims, 17 Drawing Sheets

STAGGERED LINES FOR INTERCONNECT PERFORMANCE IMPROVEMENT AND PROCESSES FOR FORMING SUCH

TECHNICAL FIELD

Embodiments of the disclosure pertain to staggered interconnect lines and, in particular, to staggered interconnect lines for interconnect performance improvement.

BACKGROUND

Low-k interlayer dielectrics (ILDs) and air gaps are used between structures in various interconnect technologies in order to reduce line-to-line capacitance as a means of improving overall performance. Interconnect structures that use low-k ILDs trade off improvements in line-to-line capacitance with reductions in patternability and mechanical stability and thus can be difficult to integrate. For copper layers, the use of air-gaps necessitates a moderate-k etch stop to hermetically seal the copper and prevent it from oxidizing. However, the etch stop material fills space between interconnect lines and reduces the overall capacitance benefit.

DESCRIPTION OF THE EMBODIMENTS

Figure 1:
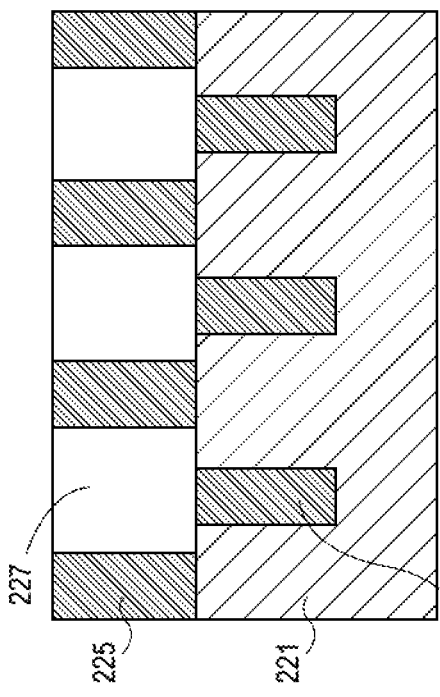
FIG. 1 illustrates an interconnect structure according to a previous approach.

Staggered interconnect lines for interconnect line performance is described. It should be appreciated that although embodiments are described herein with reference to example staggered interconnect line implementations, the disclosure is more generally applicable to staggered interconnect line implementations as well as other type staggered interconnect lines implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

The use of low-k interlayer dielectrics (ILDs) and air gaps between structures in interconnect technologies to reduce line-to-line and layer-to-layer capacitance in order to improve overall performance is a feature of previous approaches. Interconnect structures that use low-k ILDs trade off improvements in line-to-line capacitance with reductions in patternability and mechanical stability and are thus difficult to integrate. Air-gaps have been used in some products for 80 nm and 160 nm pitches. For copper layers, the use of air-gaps necessitates a moderate-k etch stop to hermetically seal the copper and prevent it from oxidizing. However, the etch stop material can fill space between interconnect lines and reduce the overall capacitance benefit.

An approach that addresses the shortcomings of previous approaches is disclosed herein. For example, as part of a disclosed process, adjacent interconnect lines are staggered. In addition, optionally, an air gap can be formed adjacent each interconnect line in order to obtain the maximum reductions in line-to-line capacitance (e.g., the maximum benefit).

FIG. 1 illustrates an interconnect structure that includes horizontally aligned interconnect lines according to a previous approach. FIG. 1 shows dielectric 101, interconnect lines 103 and air-gaps 105.

Referring to FIG. 1, the interconnect lines 103 are formed above the dielectric 101. The interconnect lines 103 are separated by the air-gaps 105. The air-gaps 105 are used to reduce line-to-line capacitance. A drawback of this approach is that for copper interconnects, as a part of forming the adjacent air-gaps 105, the use of a moderate-k etch stop layer is required in order to hermetically seal the copper and to prevent the copper from oxidizing. However, the etch stop material can occupy space between the lines which can reduce the overall benefit.

Figure 2A:
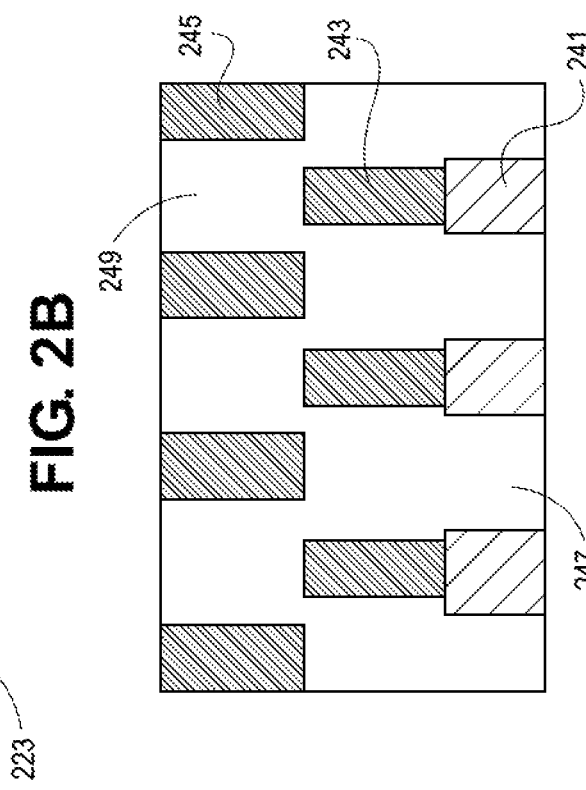
FIG. 2A illustrates a staggered line interconnect structure according to an embodiment.

FIG. 2A illustrates a staggered line interconnect structure according to an embodiment. In an embodiment, as shown in FIG. 2A, the staggered line interconnect structure can include dielectric 201, interconnect lines 203, and interconnect lines 205. Referring to FIG. 2A, in an embodiment, the interconnect lines 203 and the interconnect lines 205 can be formed in the dielectric 201. Moreover, in the FIG. 2A embodiment, the interconnect lines 203 and the interconnect lines 205 can be staggered. In particular, the interconnect lines 205 can be formed in a row above the interconnect lines 203 and the interconnect lines 205 can be laterally offset from the interconnect lines 203 formed below them. For example, as shown in FIG. 2A, the individual interconnect lines of the interconnect lines 203 are formed below and between the individual interconnect lines of the interconnect lines 205. In this embodiment, the staggering of the interconnect lines 203 and the interconnect lines 205 is used to reduce line-to-line capacitance in the interconnect structure.

Figure 2B:
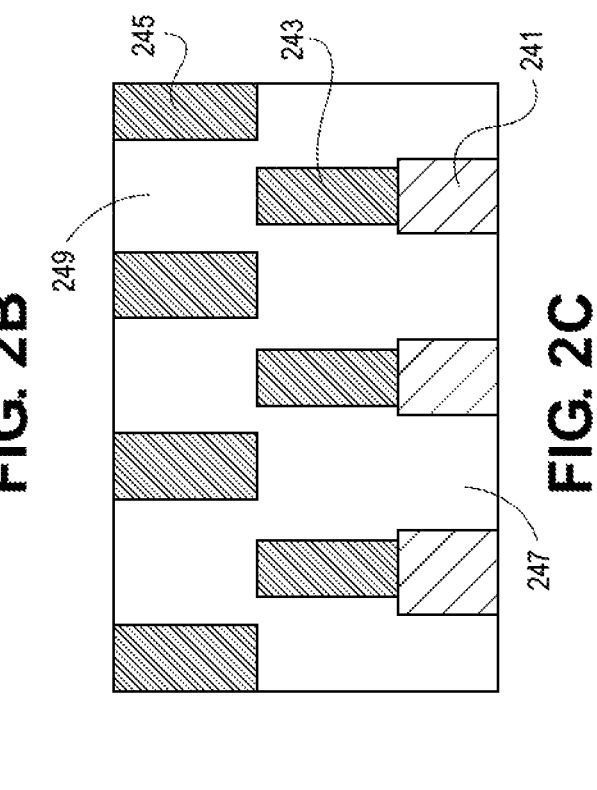
FIG. 2B illustrates an interconnect structure that includes staggered lines and air-gaps in a staggered line according to an embodiment.

FIG. 2B illustrates an interconnect structure that includes staggered lines and air-gaps in one of the staggered lines according to an embodiment. In the FIG. 2B embodiment, the interconnect structure includes dielectric 221, interconnect lines 223, interconnect lines 225 and air-gaps 227.

Referring to FIG. 2B, in an embodiment, the interconnect lines 223 can be formed in the dielectric 221 and the interconnect lines 225 can be formed above the dielectric 221. In addition, the interconnect lines 225 can be separated by the air-gaps 227. In the FIG. 2B embodiment, the interconnect lines 223 and the interconnect lines 225 can be staggered. In particular, the interconnect lines 225 can be formed in a row above the interconnect lines 223 and can be laterally offset from the interconnect lines 223 with the interconnect lines 223 being formed underneath the air-gaps 227. For example, the individual interconnect lines of the interconnect lines 223 can be formed below and between the individual interconnect lines of the interconnect lines 225. In this embodiment, the staggering of the interconnect lines 223 and the interconnect lines 225, and the use of the air-gaps 227, operate together to reduce line-to-line capacitance in the interconnect structure.

Figure 2C:
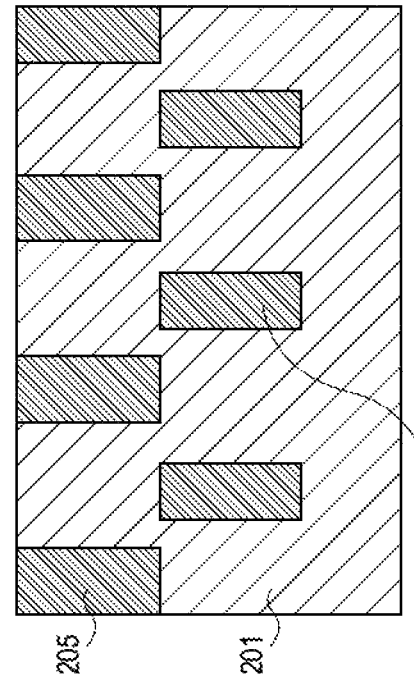
FIG. 2C illustrates an interconnect structure that includes staggered lines with air-gaps in each of the staggered lines according to an embodiment.

FIG. 2C illustrates an interconnect structure that includes staggered lines with air-gaps in each of the staggered lines according to an embodiment. In an embodiment, as shown in FIG. 2C, the interconnect structure can include dielectric 241, interconnect lines 243, interconnect lines 245, air-gaps 247 and air-gaps 249.

Referring to FIG. 2C, in an embodiment, the interconnect lines 243 can be formed above the dielectric 241 and below the air-gaps 249 between the individual lines of the interconnect lines 245. Moreover, the interconnect lines 245 can be formed above the air-gaps 247 that are formed between the individual lines of the interconnect lines 243. In the FIG. 2C embodiment, the interconnect lines 243 and the interconnect lines 245 can be staggered. In particular, the interconnect lines 245 can be formed in a row above the interconnect lines 243 and can be laterally offset from the interconnect lines 243. In this embodiment, both the staggering of the interconnect lines 243 and the interconnect lines 245, and the use of the air-gaps 247 and the air-gaps 249, operate to reduce line-to-line capacitance in the interconnect structure.

Figure 3A:
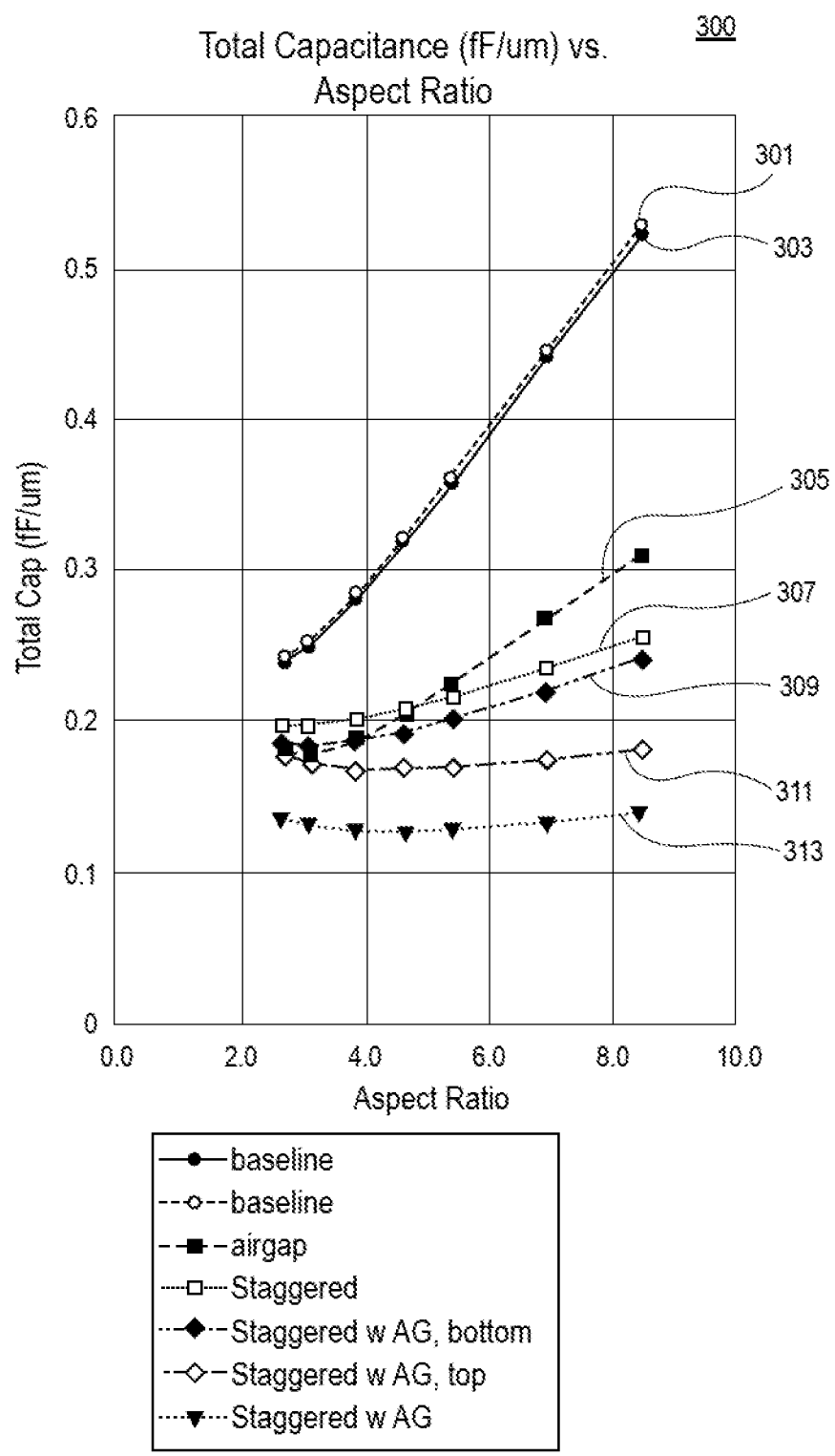
FIGS. 3A and 3B are illustrations of graphs of total capacitance versus aspect ratio and normalized 1/RC versus aspect ratio for various configurations of interconnect structures described with reference to FIGS. 2A-2C.
Figure 3B:
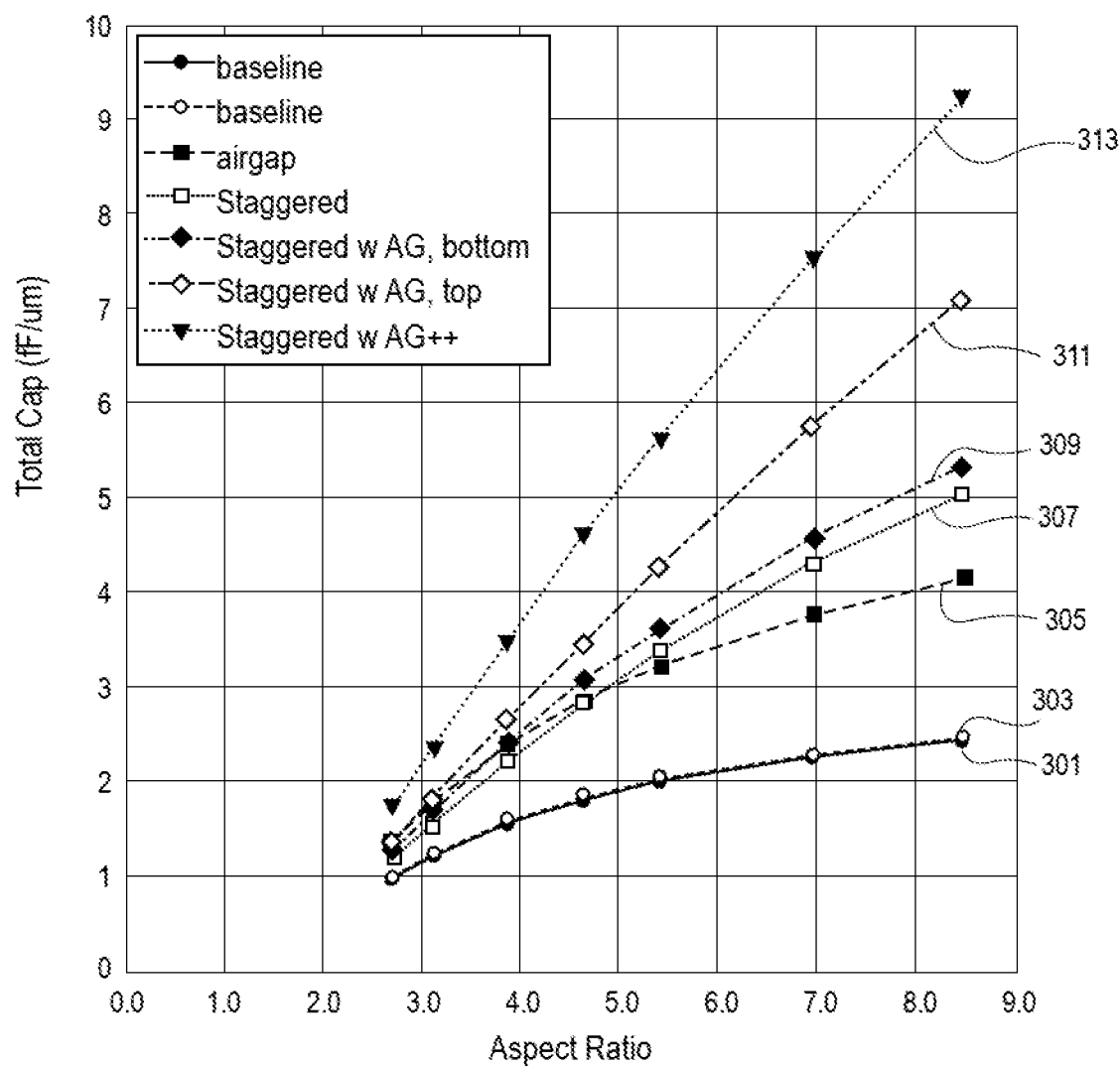

FIGS. 3A and 3B illustrate graphs of total capacitance versus aspect ratio 300 and normalized 1/RC versus aspect ratio 350 for various configurations of interconnect structures such as those described with reference to FIGS. 2A-2C. The configurations of interconnect structures include, un-staggered lines with no air-gaps between them 301, un-staggered lines with no air-gaps between them 303, un-staggered lines with air-gaps 305, staggered lines 307, staggered lines with air-gaps in bottom lines 309, staggered lines with air-gaps in top line 311, and staggered lines with air-gaps in the top and bottom lines 313.

Referring to FIG. 3A, graph 300 shows that the best performance as regards reducing line-to-line capacitance is provided by staggered lines with air-gaps in the top and bottom lines 313. Moreover, graph 300 shows that the configurations staggered lines with air-gaps between top lines 311 and staggered lines with air-gaps between bottom lines 309 provide the next best performances. Between these configurations, the configuration staggered lines with air-gaps between top lines 311 provides the better performance. The next best performing configuration is the staggered lines 307 configuration. The line configurations of previous approaches are the least well performing configurations and are in order of their performance, un-staggered lines with air-gaps 305, un-staggered lines with no air-gaps 303 and un-staggered lines with no air-gaps 301.

Referring to FIG. 3B, graph 350 shows that the best performance as regards reducing line-to-line capacitance is provided by staggered lines with air-gaps in the top and bottom lines 313. Moreover, graph 350 shows that the configurations staggered lines with air-gaps between bottom lines 309 and staggered lines with air-gaps between top lines 311 provide the next best performances. Between these configurations, staggered lines with air-gaps between the top lines 311 provides the better performance. The next best performing configuration is the staggered lines 307 configuration. The line configurations of previous approaches are the least well performing configurations and are in order of their performance, un-staggered line with air-gaps 305 and un-staggered lines with no air-gap between them 303 and 301.

Figure 4A:
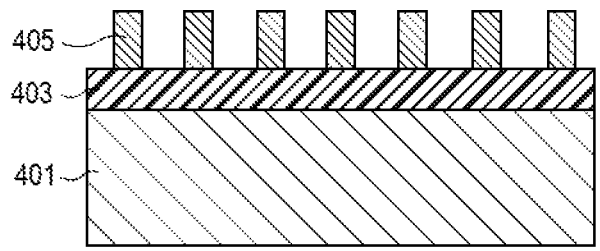
FIGS. 4A-4K illustrate cross-sections of an interconnect structure at stages during the fabrication of the interconnect structure according to an embodiment.

FIGS. 4A-4K show cross-sections of an interconnect structure at stages during the fabrication of the interconnect structure according to an embodiment. In FIG. 4A, the initial structure includes interlayer dielectric (ILD) 401, dielectric 403 and grating patterned material 405.

Referring to FIG. 4A, the grating patterned material 405 remains on the surface of the interconnect structure after a pattern transfer is performed using grating lithography. In an embodiment, grating lithography involves the transfer of a grating pattern to the structure. In an embodiment, the grating lithography can include but is not limited to electron beam lithography, X-ray lithography, projection lithography, contact exposure or proximity exposure. In other embodiments, the grating lithography can be performed in other manners. In an embodiment, gratings can be formed using pitch division, multi-patterning or other techniques. In an embodiment, such techniques can include but are not limited to self-aligned double patterning (SADP), self-aligned quadruple patterning (SAQP), self-aligned octuple patterning (SAOP), litho etch litho etch (LELE), or litho etch litho etch litho etch (LELELE).

Figure 4B:
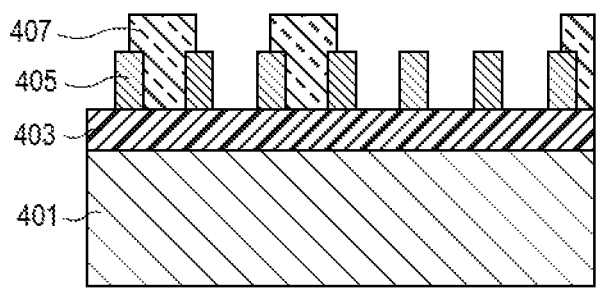

Referring to FIG. 4B, subsequent to one or more operations that result in the structure shown in FIG. 4A, a pattern transfer is performed using plug lithography. In an embodiment, plug lithography involves the transfer of a plug pattern 407 to the interconnect structure. In an embodiment, the plug lithography can include but is not limited to electron beam lithography, X-ray lithography, projection lithography, contact exposure or proximity exposure.

Figure 4C:
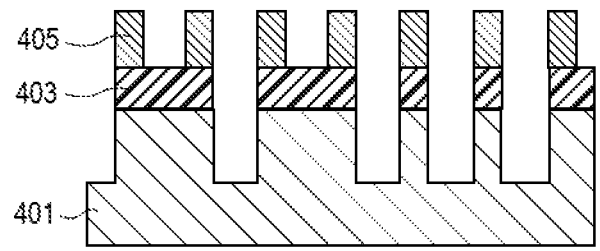

Referring to FIG. 4C, subsequent to one or more operations that result in the structure shown in FIG. 4B, an etch into the ILD 401 is performed. In an embodiment, the etch into the ILD 401 can be an anisotropic dry etch. In other embodiments, other manners of etching can be used such as isotropic or wet etching.

Figure 4D:
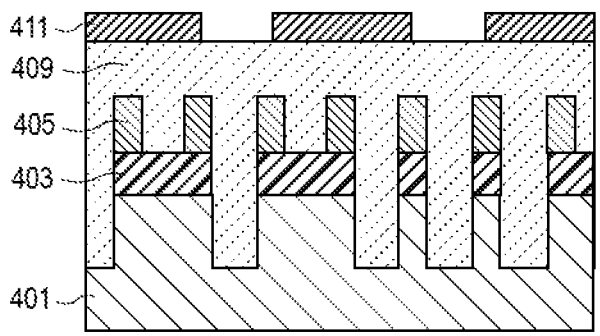

Referring to FIG. 4D, subsequent to one or more operations that result in the structure shown in FIG. 4C, a dielectric 409 is formed on the surface of the structure in exposed spaces. In an embodiment, the dielectric 409 can be a spin-coated sacrificial hardmask. Thereafter, via lithography is performed where a via pattern 411 is transferred to the surface of the interconnect structure. In other embodiments, the dielectric 409 can be formed by chemical vapor deposition (CVD), plasma enhanced chemical vapor deposition (PECVD), or atomic layer deposition (ALD). In still other embodiments, the dielectric 409 can be formed using other manners of forming a dielectric. In an embodiment, the via lithography can be performed using electron beam lithography, X-ray lithography, projection lithography, contact exposure or proximity exposure. In other embodiments, the via lithography can be performed in other suitable manners.

Figure 4E:
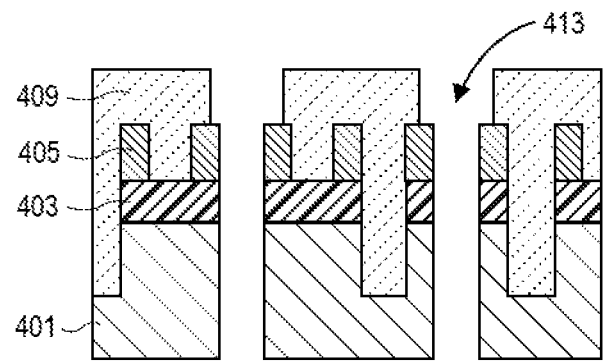

Referring to FIG. 4E, subsequent to one or more operations that result in the structure shown in FIG. 4D, a via etch is performed to form vias 413. In an embodiment, the via etch can be a wet etch or a dry etch. In an embodiment, the via etch can be an isotropic etch. In other embodiments, the via etch can be an anisotropic etch.

Figure 4F:
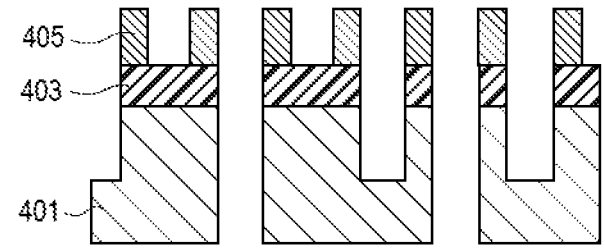

Referring to FIG. 4F, subsequent to one or more operations that result in the structure shown in FIG. 4E, a carbon hardmask (CHM) ash and cleans is performed. In an embodiment, the cleaning can be performed to prevent contamination. In an embodiment, the CHM ash and cleans results in the removal of the dielectric 409 and the via pattern 411.

Figure 4G:
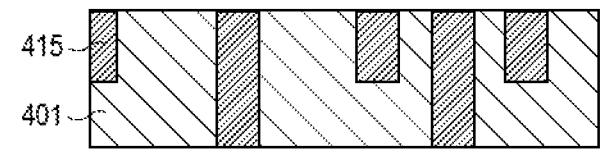

Referring to FIG. 4G, subsequent to one or more operations that result in the structure shown in FIG. 4F, a metal 415 is formed in the vias and trenches and a chemical mechanical polishing (CMP) is performed. In an embodiment, the metal 415 can be formed in the vias and the trenches by electroplating or electroless plating, chemical vapor deposition (CVD), plasma enhanced chemical vapor deposition (PECVD), atomic layer deposition (ALD), or physical deposition processes. In other embodiments, the metal can be formed in the vias and the trenches using any other suitable manner of forming the metal in the vias and the trenches. In addition, the dielectric 403 and the grating patterned material 405 are removed.

Figure 4H:
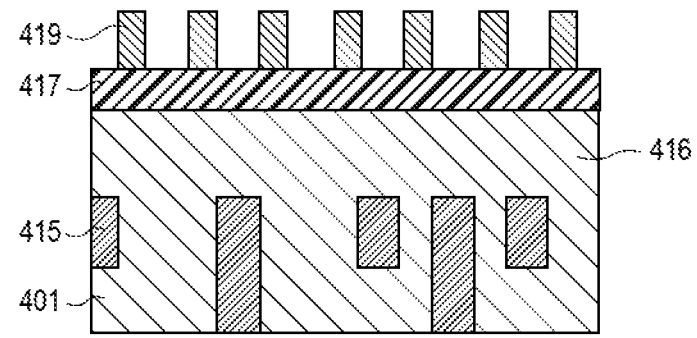

Referring to FIG. 4H, subsequent to one or more operations that result in the structure shown in FIG. 4G, an ILD deposition is performed and a pattern transfer is performed using grating lithography. As part of the ILD deposition and pattern transfer, ILD 416, dielectric 417 and grating patterned material 419 are formed on the interconnect structure. In an embodiment, the ILD deposition can be performed by chemical vapor deposition (CVD), plasma enhanced chemical vapor deposition (PECVD), atomic layer deposition (ALD), or physical deposition processes. In other embodiments, the ILD deposition can be performed using any other suitable manner of performing an ILD deposition. In an embodiment, the grating lithography can be performed based on electron beam lithography, X-ray lithography, projection lithography, contact exposure or proximity exposure. In other embodiments, the grating lithography can be performed using any other suitable manner of performing grating lithography.

Figure 4I:
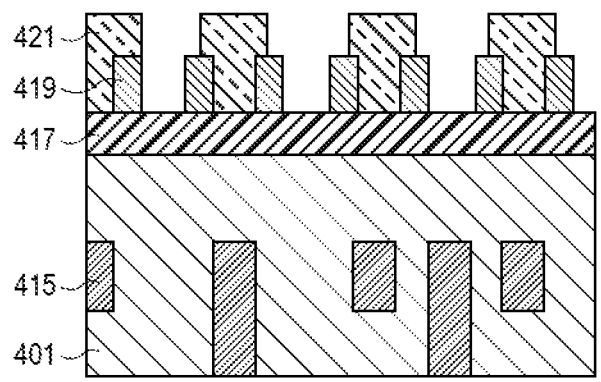

Referring to FIG. 4I, subsequent to one or more operations that result in the structure shown in FIG. 4H, a pattern transfer is performed using plug lithography where a plug pattern 421 is formed on the interconnect structure. In an embodiment, the plug lithography used can include electron beam lithography, X-ray lithography, projection lithography, contact exposure or proximity exposure. In other embodiments, the plug lithography used can include any other suitable manner of manner of performing plug lithography.

Figure 4J:
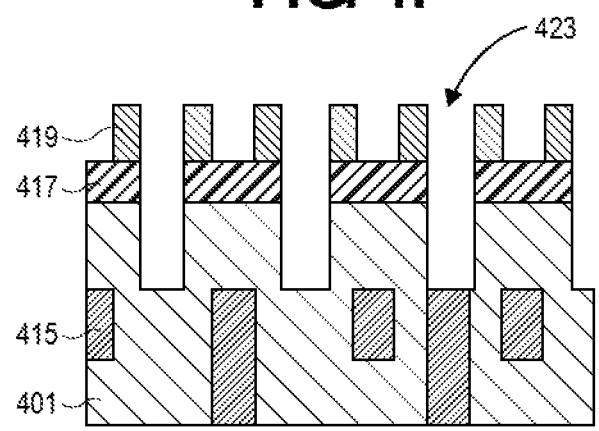

Referring to FIG. 4J, subsequent to one or more operations that result in the structure shown in FIG. 4I, an etch into the ILD is performed that forms vias 423. In an embodiment, the etch into the ILD can be a wet etch or a dry etch. In an embodiment, the etch into the ILD can be an isotropic etch. In other embodiments, the etch into the ILD can be an anisotropic etch. In addition, in an embodiment, the plug pattern 421 can be removed.

Figure 4K:
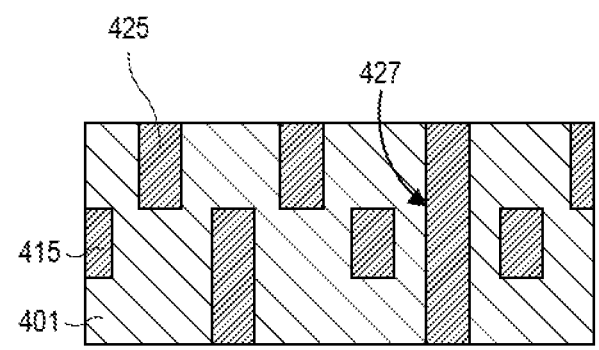

Referring to FIG. 4K, subsequent to one or more operations that result in the structure shown in FIG. 4J, metal 425 and metal 427 is formed in the vias 423 and a CMP is performed. In an embodiment, the metal 425 and 427 can be formed by plating, chemical vapor deposition (CVD), plasma enhanced chemical vapor deposition (PECVD), atomic layer deposition (ALD), or physical deposition processes. In other embodiments, the metal can be formed using any other suitable manners of forming a metal. In addition, in an embodiment, as part of the CMP, the ILD 416, the dielectric 417 and the grating patterned material 419 are removed.

Figure 5A:
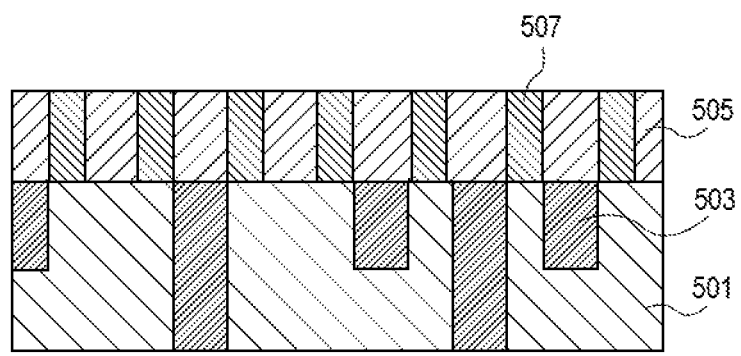
FIGS. 5A-5D illustrate cross-sections of an interconnect structure at stages during the fabrication of the interconnect structure according to an embodiment.

FIGS. 5A-5D illustrate cross-sections of a interconnect structure at stages during the fabrication of the interconnect structure according to an embodiment. Referring to FIG. 5A, subsequent to a plurality of operations similar to those described with reference to FIGS. 4A-4G, a directed self-assembly (DSA) is performed. In an embodiment, the DSA causes the formation of the grating pattern 507 and the dielectric material 505. In an embodiment, the DSA can cause the formation of a self-aligned grating pattern.

Figure 5B:
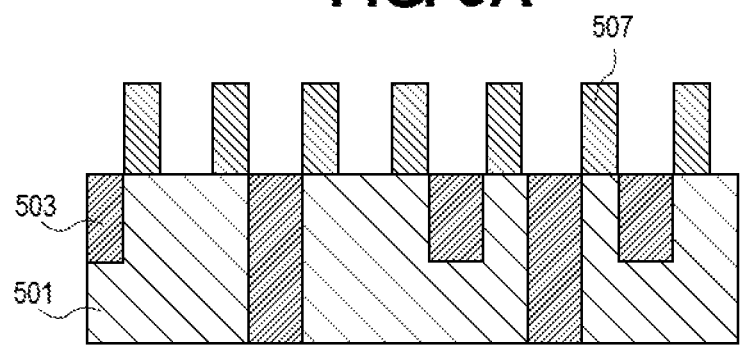

Referring to FIG. 5B, subsequent to one or more operations that result in the structure shown in FIG. 5A, the DSA including the dielectric material 505 is removed such that it can be replaced with permanent material. In an embodiment, after the removal of the dielectric material 505, the grating pattern 507 remains.

Figure 5C:
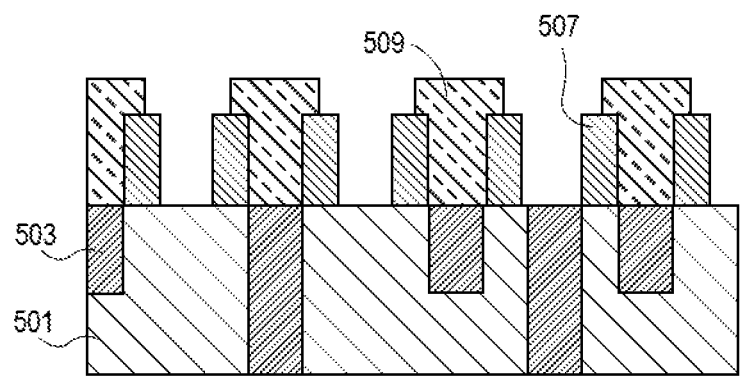

Referring to FIG. 5C, subsequent to one or more operations that result in the structure shown in FIG. 5B, a plug pattern 509 is formed on the structure. In an embodiment, the plug pattern 509 can be formed by plug lithography. In an embodiment, the plug lithography method can include electron beam lithography, X-ray lithography, projection lithography, contact exposure or proximity exposure. In other embodiments, the plug lithography method can include any suitable manner of manner of performing plug lithography.

Figure 5D:
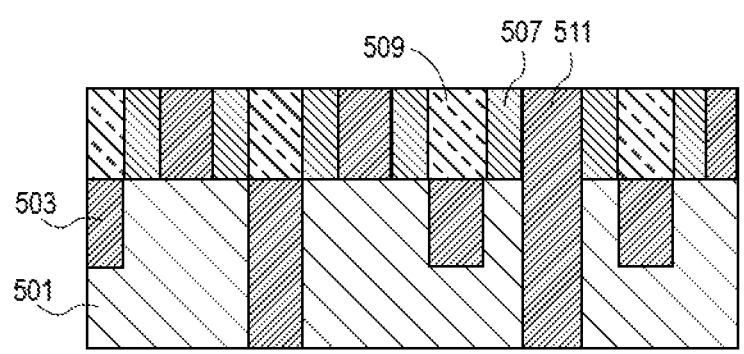

Referring to FIG. 5D, after one or more operations that result in the structure shown in FIG. 5C, metal 511 is formed in the spaces defined by the plug patterning and a second CMP is performed to planarize the structure. In an embodiment, the metal 511 can be formed by plating, chemical vapor deposition (CVD), plasma enhanced chemical vapor deposition (PECVD), atomic layer deposition (ALD), or physical deposition processes. In other embodiments, the metal 511 can be formed using any other suitable manner of forming a metal in the spaces defined by plug patterning.

Figure 6:
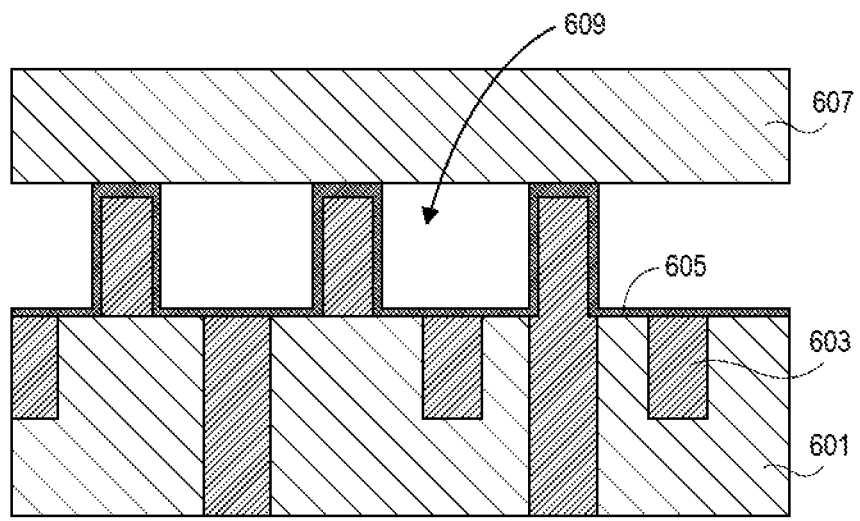
FIG. 6 illustrates a cross-section of an interconnect structure according to an embodiment.

FIG. 6 is an illustration of a cross-section of a interconnect structure according to an embodiment. Referring to FIG. 6, subsequent to operations similar to those shown in FIGS. 4A-4G, an air-gap etch, an etch stop deposition, and an ILD deposition is performed. In FIG. 6, the completed structure includes ILD 601, vias 603, etch stop 605, air-gaps 609 and capping layer 607 (formed from the aforementioned ILD deposition).

Figure 7A:
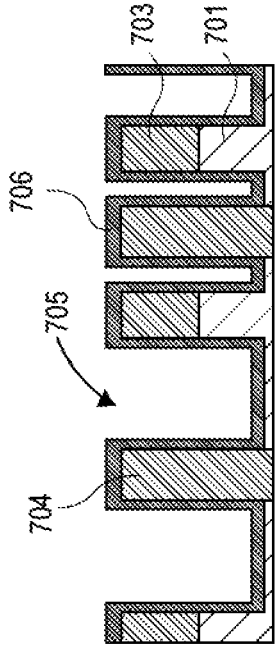
FIGS. 7A-7L illustrate cross-sections of an interconnect structure at stages during the fabrication of the interconnect structure according to an embodiment.

FIGS. 7A-7L is an illustration of a cross-section of a interconnect structure at stages during the fabrication of the interconnect structure according to an embodiment. Referring to FIG. 7A, subsequent to one or more operations similar to those described with reference to FIGS. 4A-4G, an air-gap etch and cleanse is performed. The resulting structure includes ILD 701, metal structure 703, extended metal structure 704, and air-gap 705. In an embodiment, the air-gap 705 etch can be a wet etch or a dry etch. In an embodiment, the air-gap 705 etch can be an isotropic etch. In other embodiments, the air-gap 705 etch can be an anisotropic etch.

Figure 7B:
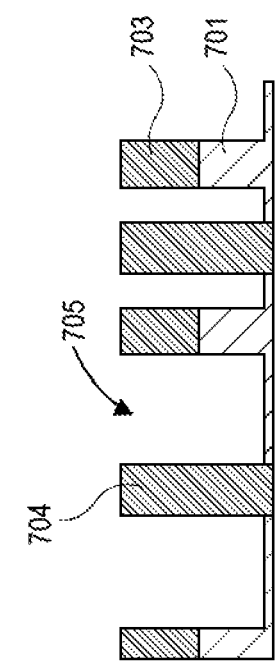

Referring to FIG. 7B, subsequent to one or more operations that result in the structure shown in FIG. 7A, a conformal deposition of etch stop 706 is performed. In an embodiment, the conformal deposition of etch stop 706 can be performed by chemical vapor deposition (CVD), plasma enhanced chemical vapor deposition (PECVD), atomic layer deposition (ALD), or physical deposition processes. In other embodiments, the etch stop deposition can be performed using any other suitable manner of performing etch stop deposition.

Figure 7C:
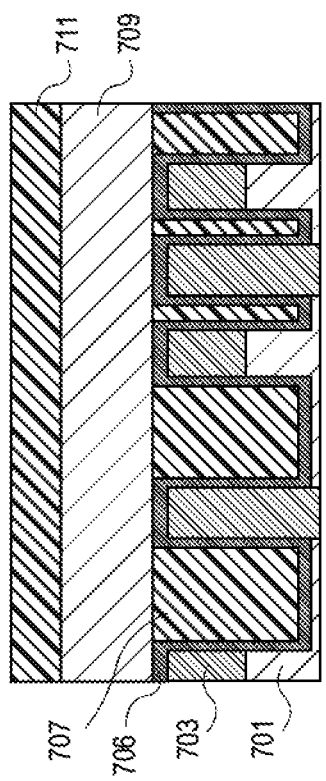

Referring to FIG. 7C, subsequent to one or more operations that result in the structure shown in FIG. 7B, a sacrificial material 707 fill and CMP is performed. In an embodiment, the sacrificial material 707 fill can be performed using chemical vapor deposition (CVD), plasma enhanced chemical vapor deposition (PECVD), atomic layer deposition (ALD), or physical deposition processes. In other embodiments, the sacrificial material fill 707 can be performed using any other suitable manner of performing a sacrificial material fill.

Figure 7D:
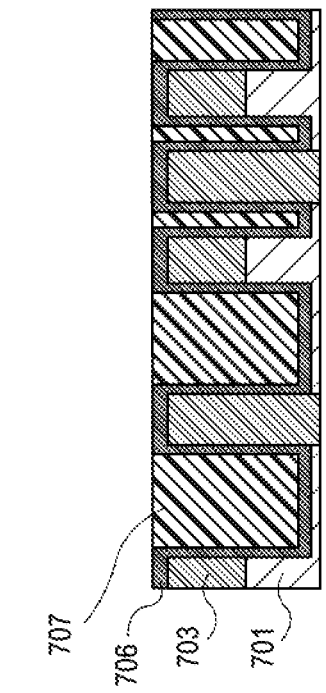

Referring to FIG. 7D, subsequent to one or more operations that result in the structure shown in FIG. 7C, a next layer ILD 709 and hard mask 711 deposition is performed. In an embodiment, the next layer ILD 709 and hard mask 711 deposition can be performed using chemical vapor deposition (CVD), plasma enhanced chemical vapor deposition (PECVD), atomic layer deposition (ALD), or physical deposition processes. In other embodiments, the next layer ILD 709 and hard mask 711 deposition can be performed using any other suitable manners of performing a next layer ILD 709 and hard mask 711 deposition.

Figure 7E:
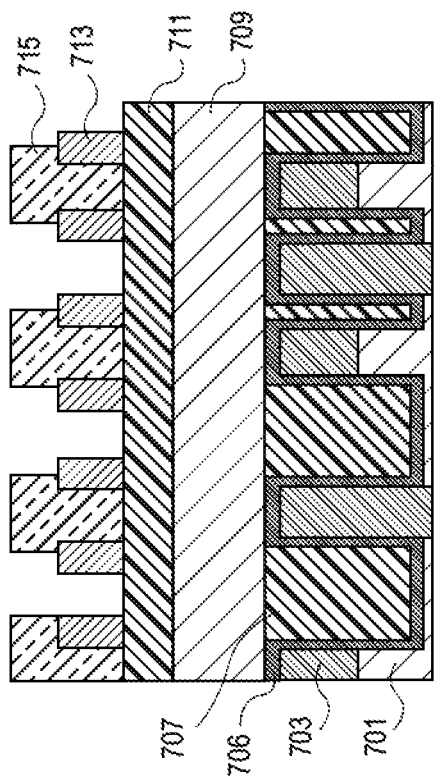

Referring to FIG. 7E, subsequent to one or more operations that result in the structure shown in FIG. 7D, a grating pattern 713 transfer is performed. In an embodiment, the grating pattern 713 transfer can be performed by electron beam lithography, X-ray lithography, projection lithography, contact exposure or proximity exposure. In other embodiments, the grating pattern 713 can be performed in any suitable manner of performing grating patterning.

Figure 7F:
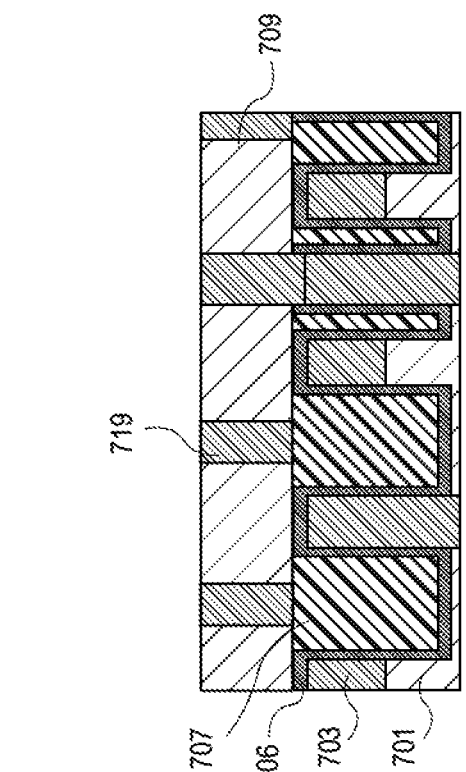

Referring to FIG. 7F, subsequent to one or more operations that result in the structure shown in FIG. 7E, a plug pattern 715 transfer is performed. In an embodiment, the plug pattern 715 transfer can be performed by electron beam lithography, X-ray lithography, projection lithography, contact exposure or proximity exposure. In other embodiments, the plug pattern 715 transfer can be performed in any suitable manner of performing plug patterning.

Figure 7G:
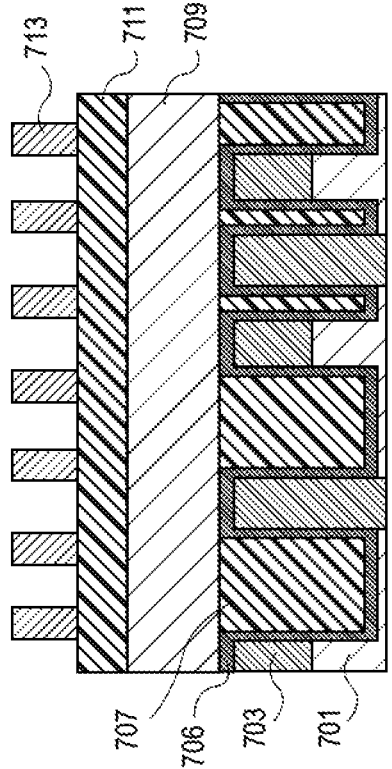

Referring to FIG. 7G, subsequent to one or more operations that result in the structure shown in FIG. 7F, an etch transfer into the ILD 709 is performed. In an embodiment, the etch transfer into the ILD 709 forms vias 717. In an embodiment, the etch transfer into the ILD 709 can be a wet etch or a dry etch. In an embodiment, the etch transfer into the ILD 709 can be isotropic. In other embodiments, the etch transfer into the ILD 709 can be an anisotropic. In addition, in an embodiment, the plug pattern 715 can be removed.

Figure 7H:
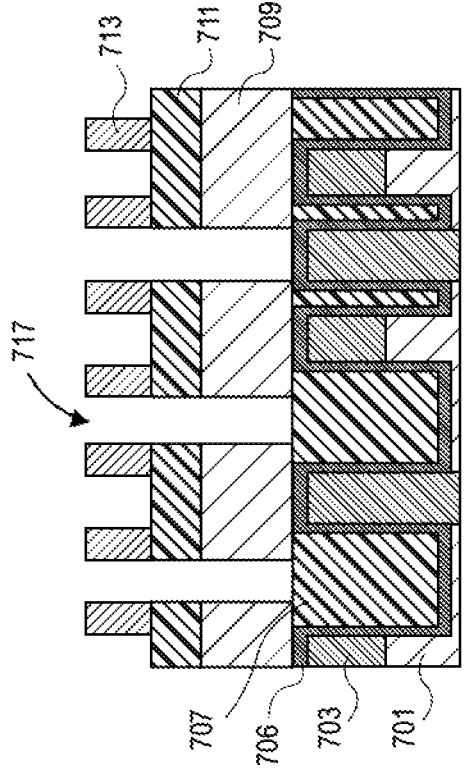

Referring to FIG. 7H, subsequent to one or more operations that result in the structure shown in FIG. 7G, metallization and CMP is performed. As part of the metallization, the metal structures 719 are formed. In an embodiment, the metallization can be performed by chemical vapor deposition (CVD), plasma enhanced chemical vapor deposition (PECVD), atomic layer deposition (ALD), or physical deposition processes. In other embodiments, the metallization can be performed using any other suitable manners of performing metallization.

Figure 7J:
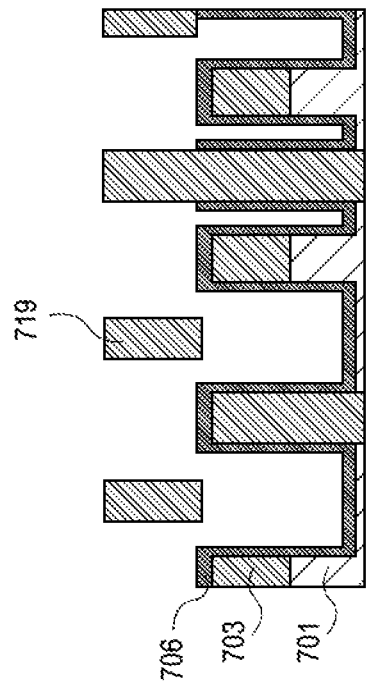
Figure 7L:
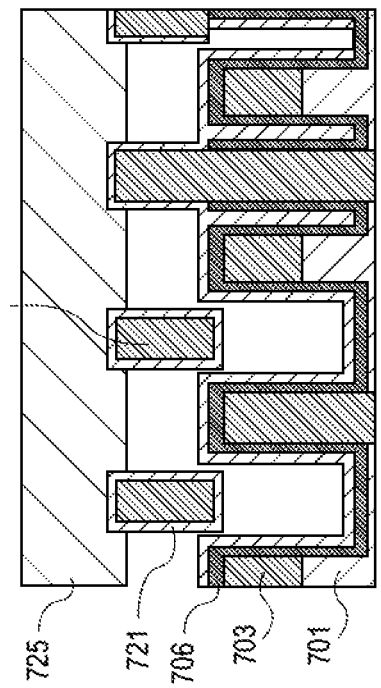
Figure 7I:
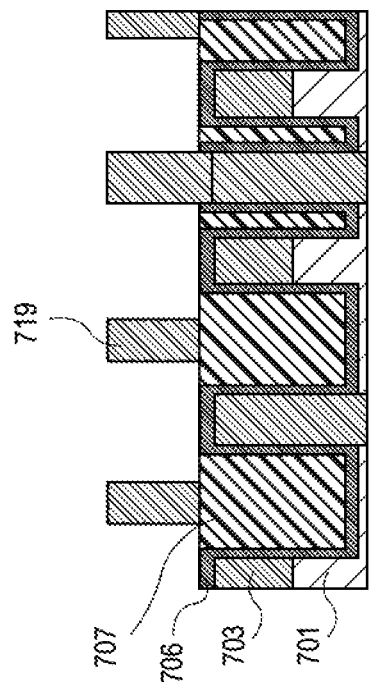

Referring to FIG. 7I, subsequent to one or more operations that result in the structure shown in FIG. 7H, an air-gap etch and cleanse is performed. In an embodiment, the air-gap etch removes the remaining parts of the ILD 709. In an embodiment, the air-gap etch can be a wet etch or a dry etch. In an embodiment, the air-gap etch can be an isotropic etch. In other embodiments, the air-gap etch can be an anisotropic etch.

Referring to FIG. 7J, subsequent to one or more operations that result in the structure shown in FIG. 7I, sacrificial material 707 is removed. In an embodiment, the sacrificial material 707 can be removed by a wet etch or a dry etch. In other embodiments, the sacrificial material 707 can be removed by an isotropic etch.

Figure 7K:
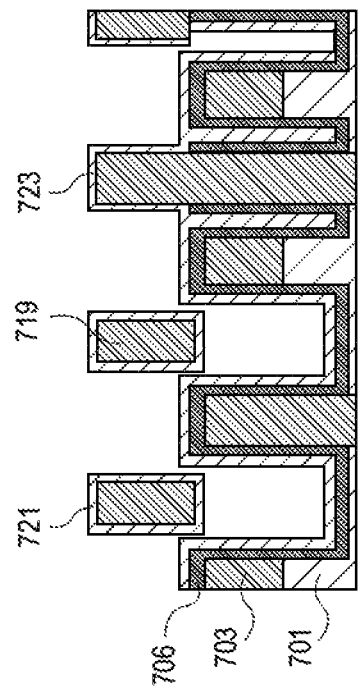

Referring to FIG. 7K, subsequent to one or more operations that result in the structure shown in FIG. 7J, an etch stop 721 and 723 deposition is performed. The etch stop 721 surrounds the upper layer metal structures 719 and the etch stop 723 surrounds the lower layer metal structures 703 and the metal structures 706 that extend into the upper layer from the lower layer. In an embodiment, the etch stop deposition can be performed using chemical vapor deposition (CVD), plasma enhanced chemical vapor deposition (PECVD), atomic layer deposition (ALD), or physical deposition processes. In other embodiments, the etch stop deposition can be performed using any other suitable manners of performing an etch stop deposition.

Referring to FIG. 7L, subsequent to one or more operations that result in the structure shown in FIG. 7K, a capping layer 725 is formed. In an embodiment, the capping layer 725 can be formed using chemical vapor deposition (CVD), plasma enhanced chemical vapor deposition (PECVD), atomic layer deposition (ALD), or physical deposition processes. In other embodiments, the capping layer 725 can be formed using other suitable manners of forming a capping layer 725.

Figure 8A:
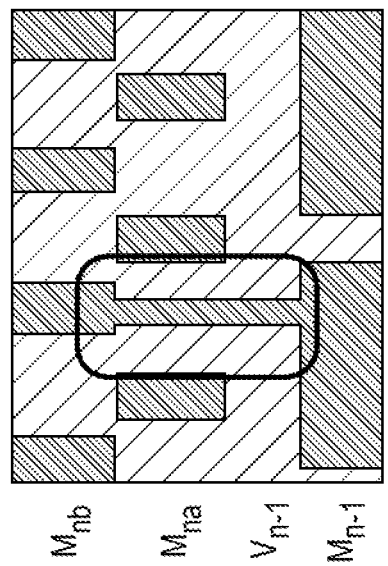
FIGS. 8A-8M illustrate different architectures of interconnect structures according to an embodiment.
Figure 8B:
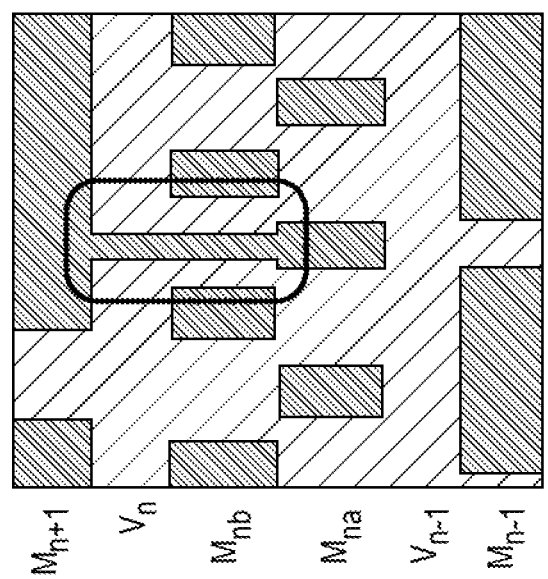
Figure 8C:
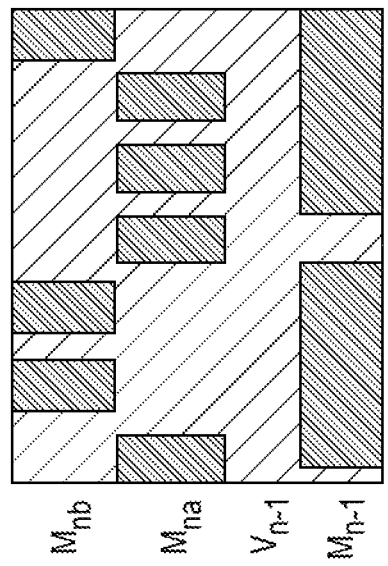
Figure 8D:
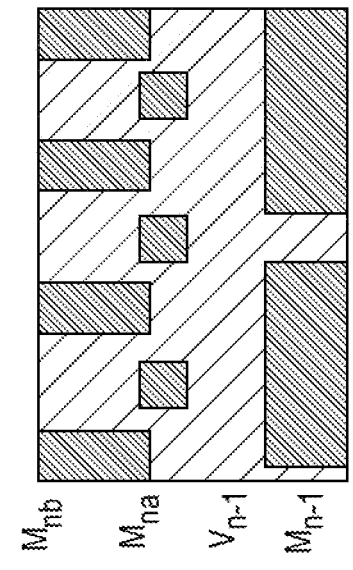
Figure 8E:
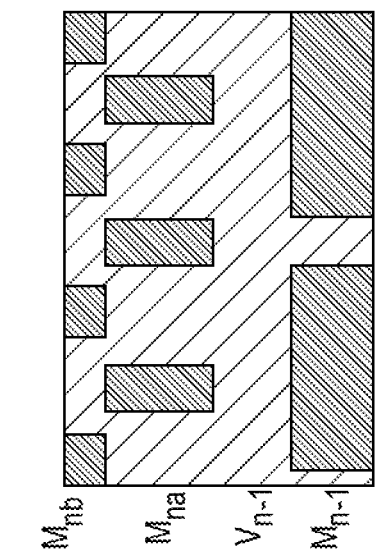
Figure 8F:
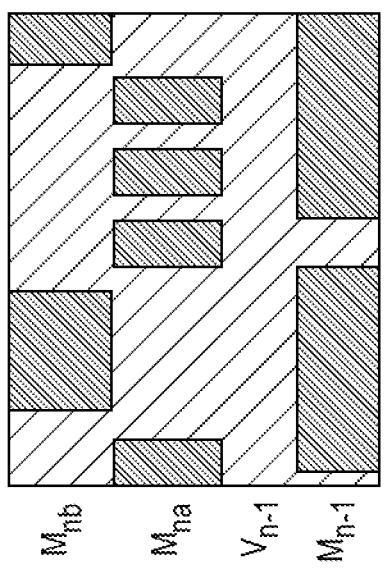
Figure 8G:
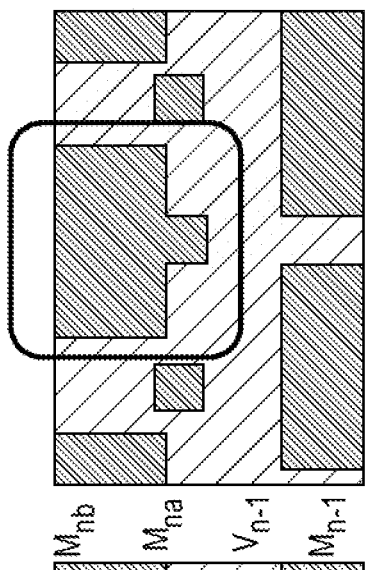
Figure 8H:
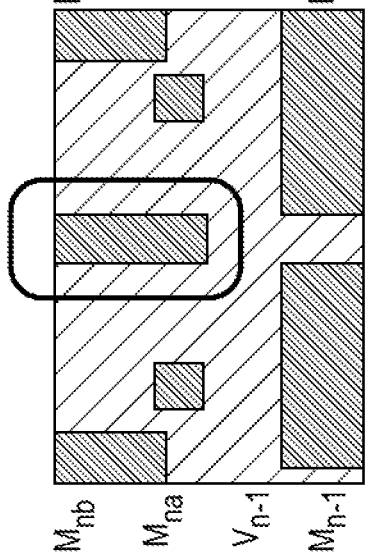
Figure 8I:
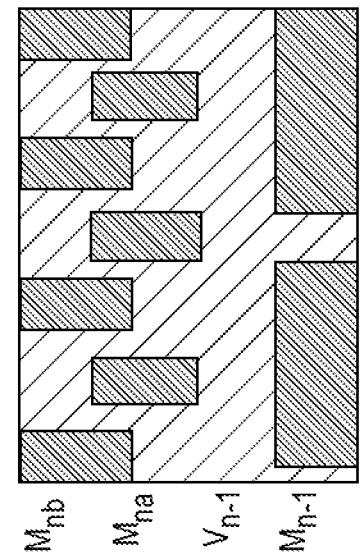
Figure 8J:
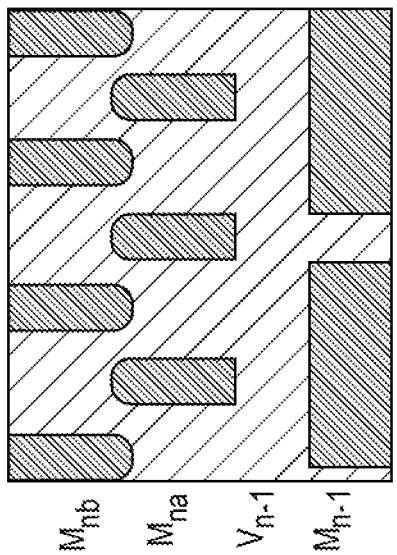
Figure 8K:
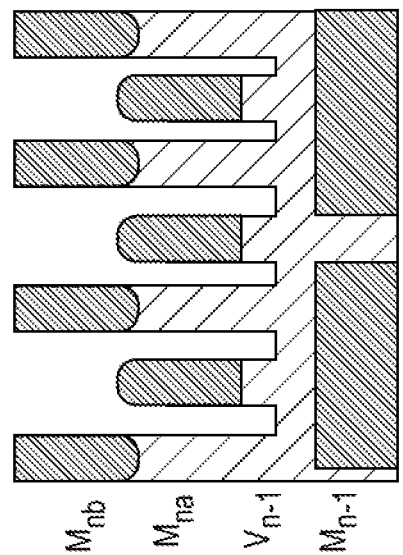
Figure 8L:
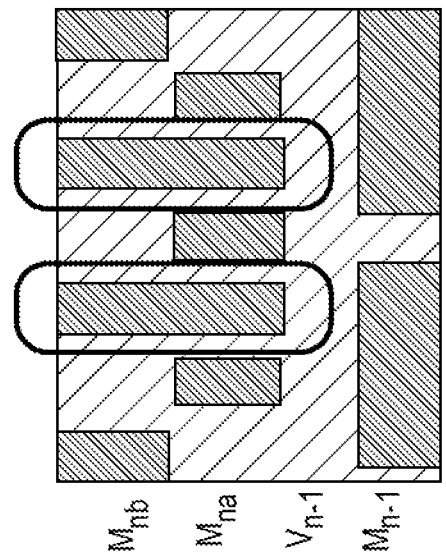
Figure 8M:
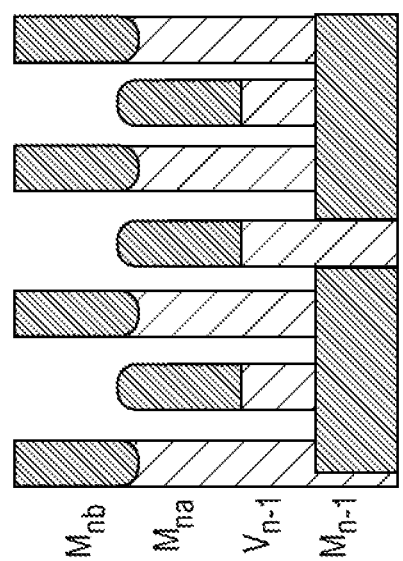

FIGS. 8A-8M illustrate various architectures of the staggered interconnect lines structure of an embodiment. FIGS. 8A-8M show architectures having a range of layers that include $M_{n-1}$, $V_{n-1}$, $M_{na}$, $M_{nb}$, $V_n$, and $M_{n+1}$. FIG. 8A illustrates a staggered architecture that includes a via that connects $M_{nb}$ to $M_{n-1}$. FIG. 8B illustrates a staggered architecture that includes a via that connects $M_{na}$ to layer $M_{n+1}$. FIG. 8C illustrates a staggered architecture with different combinations of staggered lines. FIG. 8D illustrates a staggered architecture with lines having different widths and pitches. FIG. 8E illustrates a staggered architecture with lines $M_{na}$ and $M_{nb}$ having different heights. FIG. 8F illustrates a staggered architecture with lines $M_{na}$ and $M_{nb}$ having different heights. FIG. 8G illustrates a staggered architecture with lines $M_{na}$ and $M_{nb}$ including portions that vertically overlap. FIG. 8H illustrates a staggered architecture with double strapped lines that extend across $M_{na}$ and $M_{nb}$. In an embodiment, the staggered architecture with double strapped lines can be configured to provide lower resistance such as for power and ground. FIG. 8I illustrates a staggered architecture with double strapped lines that includes both wide and narrow parts. FIG. 8J illustrates a staggered architecture with multiple double strapped lines for lowered resistance. FIG. 8K illustrates a staggered architecture having metal structures with rounded corners for lower capacitance. In an embodiment, the rounded corners can include metal structure top corners or metal structure bottom corners. In an embodiment, the rounded corners can be formed by performing an air-gap etch. In other embodiments, the rounded corners can be formed by selective growth. FIG. 8L illustrates a staggered architecture with a deep air-gap etch (etch to $M_{n-1}$). FIG. 8M illustrates a staggered architecture with a deep air-gap etch (etch to $V_{n-1}$). In an embodiment, as part of the fabrication of the interconnect structures, an etch stop between $M_{na}$ and $M_{nb}$ can assist in consistently landing the trenches. In addition, the top critical dimension can be wider than the bottom critical dimension to assist via landing.

Figure 9:
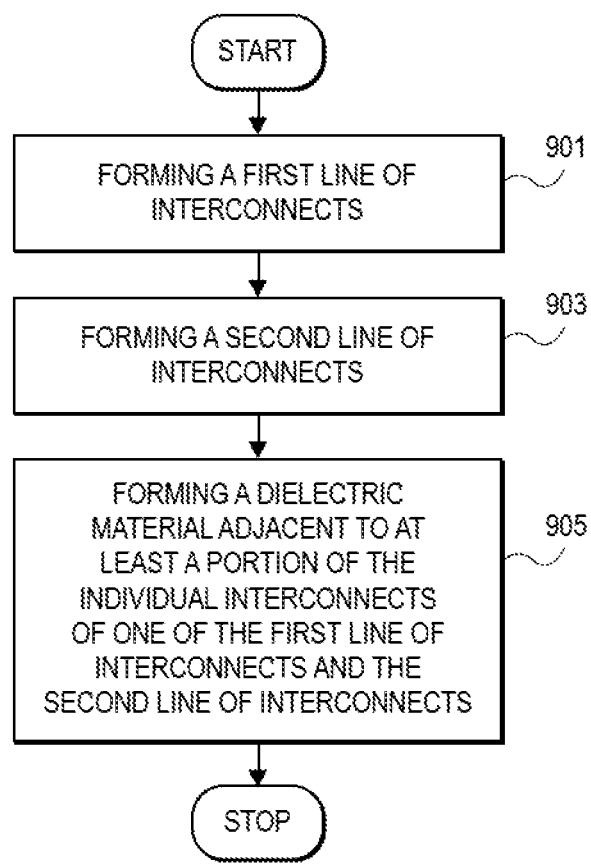
FIG. 9 illustrates a flowchart of a method for forming interconnect structures according to an embodiment.

FIG. 9 illustrates a flowchart of a method for forming an interconnect structure according to an embodiment. The method includes at 901, forming a first line of interconnects. At 903, forming a second line of interconnects. In an embodiment, the first line of interconnects and the second line of interconnects can be staggered. For example, in an embodiment, the individual interconnects of the second line of interconnects can be laterally offset from individual interconnects of the first line of interconnects. At 905, forming a dielectric material adjacent to at least a portion of the individual interconnects of one of the first line of interconnects and the second line of interconnects. In an embodiment, the interconnect structure can include air-gaps between the individual interconnects of the first line of interconnects. In an embodiment, the interconnect structure can include air-gaps between the individual interconnects of the second line of interconnects. In an embodiment, both the first line of interconnects and the second line of interconnects can include air-gaps between individual interconnects. In an embodiment, the first line of interconnects and the second line of interconnects can be at least partially surrounded by etch stop. In an embodiment, the interconnect structure can include a dielectric layer above the first line of interconnects.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, or aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, or silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), organosilicates such as silsesquioxane, siloxane, or organosilicate glass. The ILD layers may include pores or air-gaps to further reduce their dielectric constant.

Figure 10:
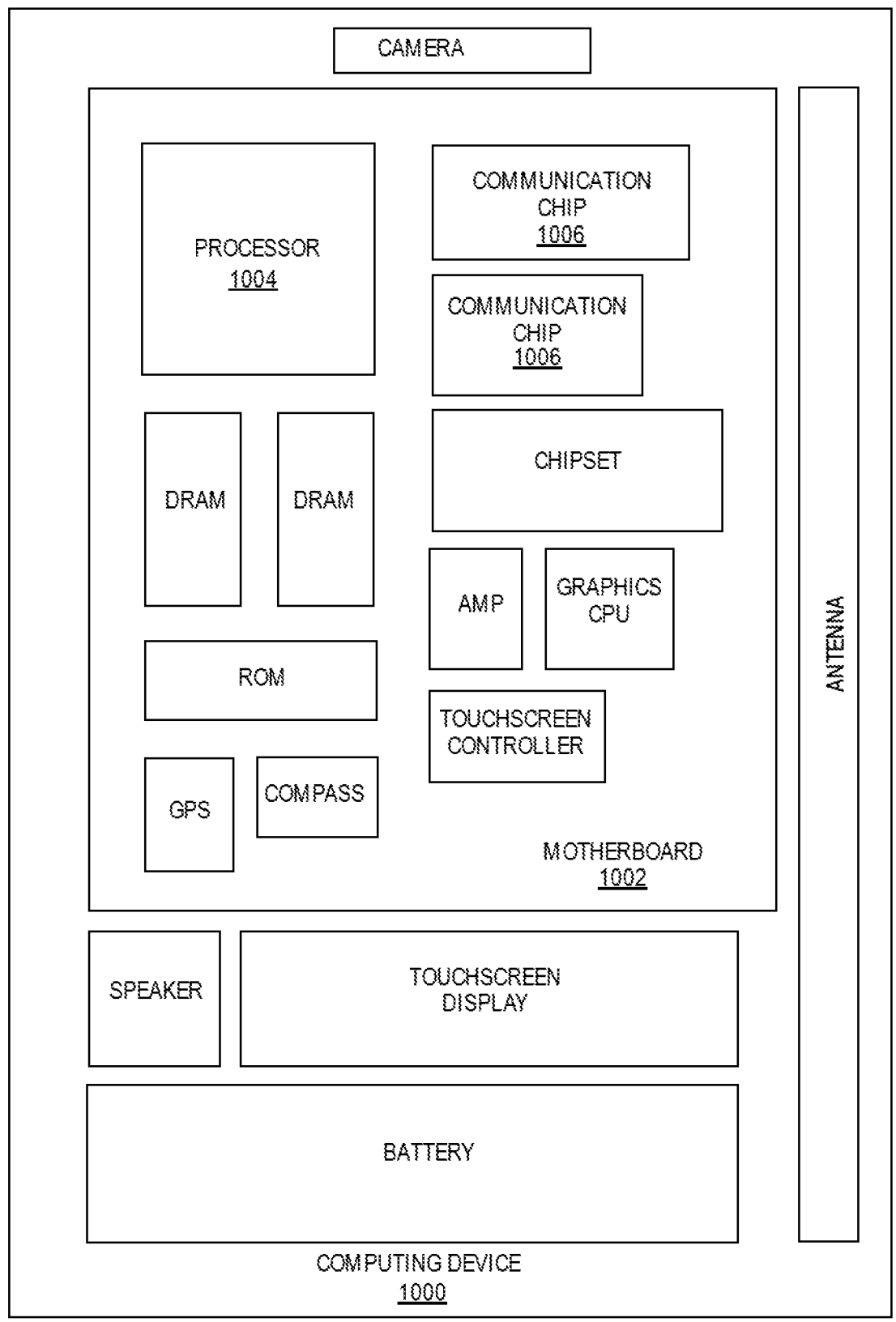
FIG. 10 illustrates a schematic of a computer system according to an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory. In an embodiment, the integrated circuit die can include one or more interconnection structures such as are described herein with reference to FIGS. 2A-2C.

The communication chip 1006 also includes an integrated circuit die packaged within the communication chip 1006. In accordance with another implementation of the invention, the integrated circuit die of the communication chip includes one or more devices, such as MOS-FET transistors built in accordance with implementations of the invention.

In further implementations, another component housed within the computing device 1000 may contain an integrated circuit die that includes one or more devices, such as MOS-FET transistors built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
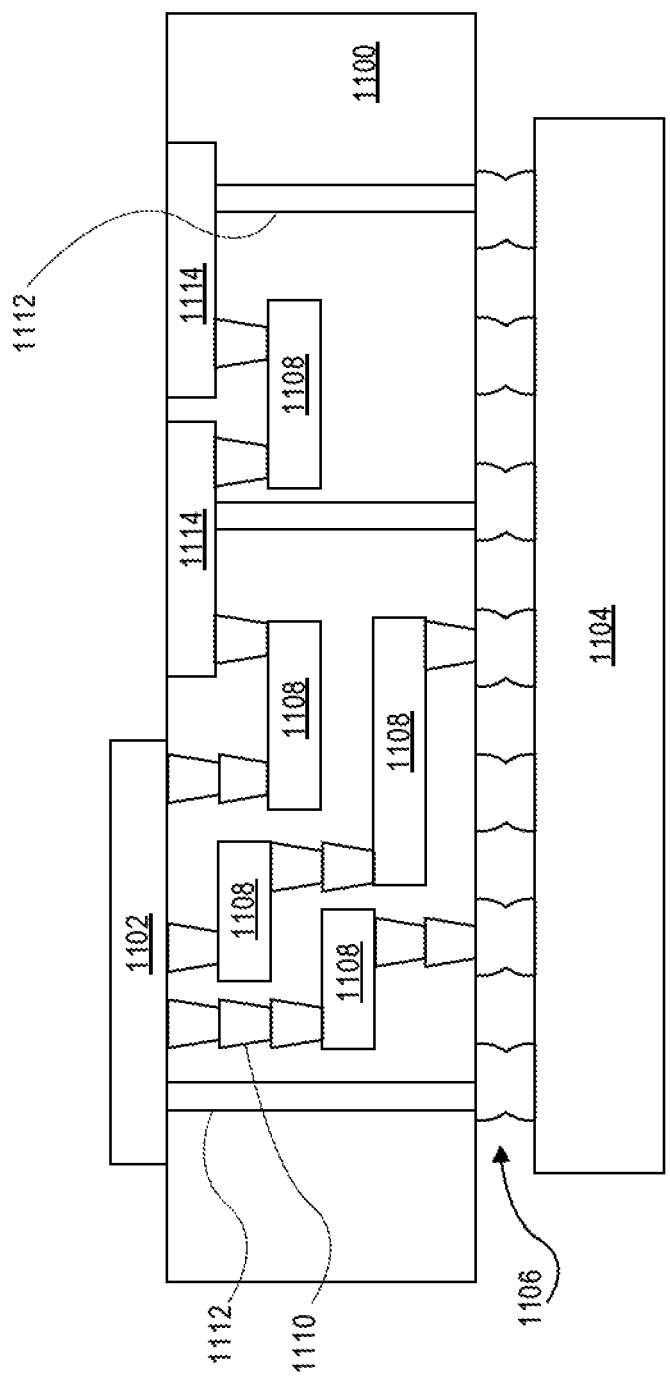
FIG. 11 illustrates an interposer that includes one or more implementations of the embodiments.

FIG. 11 illustrates an interposer 1100 that includes one or more embodiments of the invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer 1100 may be formed of alternate rigid or flexible materials that may include the same materials described above for use in a semiconductor substrate, such as silicon, germanium, or other group III-V or group IV materials.

The interposer 1100 may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, or electrostatic discharge (ESD) devices. More complex devices such as radio-frequency (RF) devices, power amplifiers, power management devices, antennas, arrays, sensors, or MEMS devices may also be formed on the interposer 1100. In accordance with embodiments of the invention, apparatuses or processes disclosed herein may be used in the fabrication of interposer 1100.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An interconnect structure, comprising, a first line of interconnects, a second line of interconnects, the first line of interconnects and the second line of interconnects are staggered, wherein individual interconnects of the second line of interconnects are laterally offset from individual interconnects of the first line of interconnects; and a dielectric material adjacent to at least a portion of the individual interconnects of at least one of the first line of interconnects and the second line of interconnects.

Example embodiment 2: The interconnect structure of example embodiment 1, further comprising air-gaps between the individual interconnects of the first line of interconnects.

Example embodiment 3: The interconnect structure of claim 1, further comprising air-gaps between the individual interconnects of the second line of interconnects.

Example embodiment 4: The interconnect structure of example embodiment 1, wherein both the first line of interconnects and the second line of interconnects includes air-gaps between individual interconnects.

Example embodiment 5: The interconnect structure of claim 1 or 4, wherein the first line of interconnects and the second line of interconnects are at least partially surrounded by etch stop.

Example embodiment 6: The interconnect structure of claim 1, 2, 3, 4, or 5 further comprising a dielectric layer above the first line of interconnects.

Example embodiment 7: An interconnect structure, including, a first line of interconnects, a second line of interconnects, the first line of interconnects and the second line of interconnects are staggered wherein individual interconnects of the second line of interconnects are laterally offset from the individual interconnects of the first line of interconnects, and a dielectric material occupies the space between individual interconnects of the first line of interconnects and individual interconnects of the second line of interconnects.

Example embodiment 8: The interconnect structure of example embodiment 7, wherein the first line of interconnects is connected to a metal layer located below the second line of interconnects.

Example embodiment 9: The interconnect structure of example embodiment 7 or 8, wherein the second line of interconnects is connected to a metal layer located above the first line of interconnects.

Example embodiment 10: The interconnect structure of example embodiment 7, 8, or 9, wherein the first line of interconnects and the second line of interconnects have different patterns.

Example embodiment 11: The interconnect structure of example embodiment 7, 8, 9, or 10, wherein the first line of interconnects and the second line of interconnects have different widths and pitches.

Example embodiment 12: The interconnect structure of example embodiment 7, 8, 9, 10, or 11, wherein the first line of interconnects and the second line of interconnects have different heights.

Example embodiment 13: The interconnect structure of example embodiment 7, 8, 9, 10, 11 or 12 wherein the first line of interconnects and the second line of interconnects overlap vertically.

Example embodiment 14: The interconnect structure of example embodiment 7, 8, 9, 10, 11, 12, or 13, wherein at least one interconnect of the first line of interconnects and at least one interconnect of the second line of interconnects together have a T structure.

Example embodiment 15: The interconnect structure of example embodiment 7, 8, 9, 10, 11, 12, 13, or 14, further comprising at least one interconnect that is a part of both the first interconnect line and the second interconnect line and extends from the first interconnect line to the second interconnect line.

Example embodiment 16: The interconnect structure of example embodiment 7, 8, 9, 10, 11, 12, 13, 14, or 15, wherein a top or bottom portion of at least one of the first line of interconnects and the second line of interconnects is rounded.

Example embodiment 17: The interconnect structure of claim 7, 8, 9, 10, 11, 12, 13, 14, 15, or 16, wherein air-gaps extend the entire length of both the first line of interconnects and the second line of interconnects.

Example embodiment 18: A system, including, a storage component, a plurality of integrated circuit die including one or more interconnection structures, the interconnection structures including, a first line of interconnects, a second line of interconnects, the first line of interconnects and the second line of interconnects are staggered, wherein individual interconnects of the second line of interconnects are laterally offset from the individual interconnects of the first line of interconnects, and a dielectric material adjacent to at least a portion of the individual interconnects of at least one of the first line of interconnects and the second line of interconnects.

Example embodiment 19: The system of example embodiment 18, wherein the first line of interconnects includes air-gaps between the individual interconnects of the first line of interconnects and the second line of interconnects includes dielectric material that fully occupies the space between the individual interconnects of the second line of interconnects.

Example embodiment 20: The system of example embodiment 18, wherein the second line of interconnects includes air-gaps between the individual interconnects of the second line of interconnects and the first line of interconnects includes dielectric material that fully occupies the space between the individual interconnects of the second line of interconnects.

Example embodiment 21: A method, including, forming a grating pattern above a hard mask on an interlayer dielectric (ILD), forming a plug pattern on the grating pattern, etching the ILD through openings in the plug pattern, forming via patterns, etching through via patterns to form first vias, performing a CHM ash and cleans, forming metal in the first vias to form a first layer of interconnects, and forming a second layer of interconnects above the first layer of interconnects.

Example embodiment 22: The method of example embodiment 21, wherein forming the second layer of interconnects above the first layer of interconnects include, forming a second ILD above the first layer of interconnects, a hard mask on the second ILD and a grating pattern on the hard mask, forming a plug pattern on the grating pattern, etching spaces into the second ILD to form second vias, and forming metal in the second vias to form the second layer of interconnects.

Example embodiment 23: The method of example embodiment 21, wherein forming the second layer of interconnects above the first layer of interconnects include, using directed self-assembly to form a grating pattern, forming a plug pattern on the grating pattern to form spaces, and forming metal in the spaces to form the second layer of interconnects.

Example embodiment 24: The method of example embodiment 21, wherein forming a second layer of interconnects above the first layer of interconnects include, forming a second ILD above the first layer of interconnects, a hard mask on the second ILD material and a grating pattern on the hard mask, forming a plug pattern on the grating pattern, etching spaces into the second ILD, forming metal in the spaces to form the second layer of interconnects, performing an air-gap etch, forming etch stop over the second layer of interconnects, and forming a second ILD above the second layer of interconnects.

Example embodiment 25: The method of example embodiment 21, further including, forming an air-gap etch between the first layer of interconnects, performing a cleans, forming conformal first etch stop material over the first layer of interconnects, forming sacrificial material above the first etch stop material, performing a CMP on the sacrificial material, forming second etch stop material on the first layer of interconnects and the second layer of interconnects, and forming a second ILD above the second layer of interconnects, wherein the forming the second layer of interconnects above the first layer of interconnects include, forming a third ILD layer and a hard mask layer above the sacrificial material, forming a second grating pattern on the hard mask, forming a second plug pattern on the grating pattern, etching spaces into the third ILD, forming metal in the spaces to form the second layer of interconnects, performing an air-gap etch and cleans, and removing the sacrificial material.

Example embodiment 26: A method including forming a first line of interconnects, forming a second line of interconnects, the first line of interconnects and the second line of interconnects are staggered, where individual interconnects of the second line of interconnects are laterally offset from individual interconnects of the first line of interconnects, and forming a dielectric material adjacent to at least a portion of the individual interconnects of at least one of the first line of interconnects and the second line of interconnects.

Example embodiment 27: The method of example embodiment 26, further comprising forming air-gaps between the individual interconnects of the first line of interconnects.

Example embodiment 28: The method of example embodiment 26, further comprising forming air-gaps between the individual interconnects of the second line of interconnects.

Example embodiment 29: The method of example embodiment 26, wherein both the first line of interconnects and the second line of interconnects includes air-gaps between individual interconnects.

Example embodiment 30: The method of example embodiment 26 or 29, wherein the first line of interconnects and the second line of interconnects are at least partially surrounded by etch stop.

Example embodiment 31: The method of example embodiment 26, 27, 28, 29, or 30, further comprising forming a dielectric layer above the first line of interconnects.

Example embodiment 32: An interconnect structure includes a first line of interconnects; a second line of interconnects below the first line of interconnects, where the first line of interconnects and the second line of interconnects are staggered, and individual interconnects of the second line of interconnects are laterally offset from individual interconnects of the first line of interconnects; dielectric material underneath the individual interconnects of the first line of interconnects and the individual interconnects of the second line of interconnects; first air gaps on each side of the individual interconnects of the second line of interconnects and second air gaps above the individual interconnects of the second line of interconnects, the second air gaps above the individual interconnects of the second line of interconnects, extending laterally between adjacent interconnects of the first line of interconnects and vertically to the top surface of the adjacent interconnects of the first line of interconnects.

What is claimed is:
1. An interconnect structure, comprising:
a first line of interconnects;
a second line of interconnects, the first line of interconnects and the second line of interconnects are staggered, wherein individual interconnects of the second line of interconnects are laterally offset from individual interconnects of the first line of interconnects; and
a dielectric material adjacent to at least a portion of the individual interconnects of at least one of the first line of interconnects and the second line of interconnects.

2. The interconnect structure of claim 1, further comprising air-gaps between the individual interconnects of the first line of interconnects.

3. The interconnect structure of claim 1, further comprising air-gaps between the individual interconnects of the second line of interconnects.

4. The interconnect structure of claim 1, wherein both the first line of interconnects and the second line of interconnects includes air-gaps between individual interconnects.

5. The interconnect structure of claim 1, wherein the first line of interconnects and the second line of interconnects are at least partially surrounded by etch stop.

6. The interconnect structure of claim 1, further comprising a dielectric layer above the first line of interconnects.

7. An interconnect structure, comprising:
a first line of interconnects;
a second line of interconnects, the first line of interconnects and the second line of interconnects are staggered wherein individual interconnects of the second line of interconnects are laterally offset from the individual interconnects of the first line of interconnects; and
a dielectric material occupies the space between individual interconnects of the first line of interconnects and individual interconnects of the second line of interconnects.

8. The interconnect structure of claim 7, wherein the first line of interconnects is connected to a metal layer located below the second line of interconnects.

9. The interconnect structure of claim 7, wherein the second line of interconnects is connected to a metal layer located above the first line of interconnects.

10. The interconnect structure of claim 7, wherein the first line of interconnects and the second line of interconnects have different patterns.

11. The interconnect structure of claim 7, wherein the first line of interconnects and the second line of interconnects have different widths and pitches.

12. The interconnect structure of claim 7, wherein the first line of interconnects and the second line of interconnects have different heights.

13. The interconnect structure of claim 7, wherein the first line of interconnects and the second line of interconnects overlap vertically.

14. The interconnect structure of claim 7, wherein at least one interconnect of the first line of interconnects and at least one interconnect of the second line of interconnects together have a T structure.

15. The interconnect structure of claim 7, further comprising at least one interconnect that is a part of both the first interconnect line and the second interconnect line and extends from the first interconnect line to the second interconnect line.

16. The interconnect structure of claim 7, wherein a top or bottom portion of at least one of the first line of interconnects and the second line of interconnects is rounded.

17. The interconnect structure of claim 7, wherein air-gaps extend the entire length of both the first line of interconnects and the second line of interconnects.

18. A system, comprising:
a storage component;
a plurality of integrated circuit die including one or more interconnection structures, the interconnection structures including:
a first line of interconnects;
a second line of interconnects, the first line of interconnects and the second line of interconnects are staggered, wherein individual interconnects of the second line of interconnects are laterally offset from the individual interconnects of the first line of interconnects; and
a dielectric material adjacent to at least a portion of the individual interconnects of at least one of the first line of interconnects and the second line of interconnects.

19. The system of claim 18, wherein the first line of interconnects includes air-gaps between the individual interconnects of the first line of interconnects and the second line of interconnects includes dielectric material that fully occupies the space between the individual interconnects of the second line of interconnects.

20. The system of claim 18, wherein the second line of interconnects includes air-gaps between the individual interconnects of the second line of interconnects and the first line of interconnects includes dielectric material that fully occupies the space between the individual interconnects of the second line of interconnects.

\* \* \* \* \*